(12) United States Patent
Colombo et al.

(10) Patent No.: US 9,227,378 B2
(45) Date of Patent: Jan. 5, 2016

(54) METHODS, DEVICES AND PROCESSES FOR MULTI-STATE PHASE CHANGE DEVICES

(75) Inventors: Davide Colombo, Milan (IT); Davide Erbetta, Trezzo sull'Adda (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 575 days.

(21) Appl. No.: 13/568,509

(22) Filed: Aug. 7, 2012

(65) Prior Publication Data

US 2014/0043893 A1 Feb. 13, 2014

(51) Int. Cl.
| | | |
|---|---|---|
| *G11C 11/00* | (2006.01) | |
| *B32B 7/02* | (2006.01) | |
| *B44C 1/22* | (2006.01) | |
| *G11C 11/56* | (2006.01) | |
| *G11C 13/00* | (2006.01) | |

(52) U.S. Cl.
CPC ... *B32B 7/02* (2013.01); *B44C 1/22* (2013.01); *G11C 11/5678* (2013.01); *G11C 13/0004* (2013.01); *G11C 13/0069* (2013.01); *G11C 2013/0078* (2013.01); *Y10T 428/24942* (2013.01)

(58) Field of Classification Search
CPC ..................................................... G11C 11/00
USPC ............. 365/46, 94, 100, 113, 129, 148, 158, 365/163; 257/2–5, 9, 296, 310, 379, 467, 257/E21.35, E31.047, E27.006; 438/29, 95, 438/96, 166, 135, 240, 259, 365, 382, 482, 438/486, 597; 977/754
See application file for complete search history.

(56) References Cited

U.S. PATENT DOCUMENTS

| | | | |
|---|---|---|---|
| 6,992,910 B1 | 1/2006 | Ju et al. | |
| 7,440,308 B2 | 10/2008 | Jeong et al. | |
| 7,463,512 B2 * | 12/2008 | Lung ............................ | 365/163 |
| 7,847,373 B2 | 12/2010 | Pirovano et al. | |
| 7,859,893 B2 * | 12/2010 | Liu et al. ...................... | 365/163 |
| 8,124,950 B2 * | 2/2012 | Happ et al. ....................... | 257/2 |
| 8,213,223 B2 * | 7/2012 | Koh et al. ..................... | 365/163 |
| 2006/0077706 A1 * | 4/2006 | Li et al. ........................ | 365/163 |
| 2008/0094873 A1 * | 4/2008 | Lai et al. ....................... | 365/148 |
| 2008/0298114 A1 * | 12/2008 | Liu et al. ....................... | 365/148 |
| 2009/0067230 A1 | 3/2009 | Koh et al. | |
| 2010/0220520 A1 | 9/2010 | Hwang et al. | |
| 2010/0308296 A1 | 12/2010 | Pirovano et al. | |
| 2011/0069539 A1 | 3/2011 | Eleftheriou et al. | |

OTHER PUBLICATIONS

Kim et al., "Applications of atomic layer deposition to nanofabrication and emerging nanodevices," Thin Solid Films, 2009, pp. 2563-2580, vol. 517, Department of Materials Science and Engineering, Pohang University of Science and Technology (POSTECH), Pohang, South Korea.

* cited by examiner

*Primary Examiner* — Harry W Byrne
(74) *Attorney, Agent, or Firm* — Knobbe, Martens, Olson & Bear LLP

(57) ABSTRACT

Devices include multiple phase change materials connected in parallel between electrodes. Memory cells with multiple parallel phase change materials can be programmed to transition among more than two states representing multiple bits of information. Methods for manufacture and use are also disclosed.

19 Claims, 6 Drawing Sheets

METHODS, DEVICES AND PROCESSES FOR MULTI-STATE PHASE CHANGE DEVICES

FIELD

Subject matter disclosed herein relates to devices including multiple phase change materials, such as phase change memory, and methods of manufacture and operation for the same.

BACKGROUND

Integrated circuit devices, which may include memory devices, for example, may be found in a wide range of electronic devices. For example, memory devices may be used in computers, digital cameras, cellular telephones, removable flash memory devices, and so forth. When selecting a memory technology for an application, a system designer may consider a physical size of a particular device, storage density, operating voltages, longevity and device stability over time, read/write speed, and/or power consumption, for example. Other example factors that may be of interest to memory system designers may include cost of manufacture, ease of manufacture, and/or reliability.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
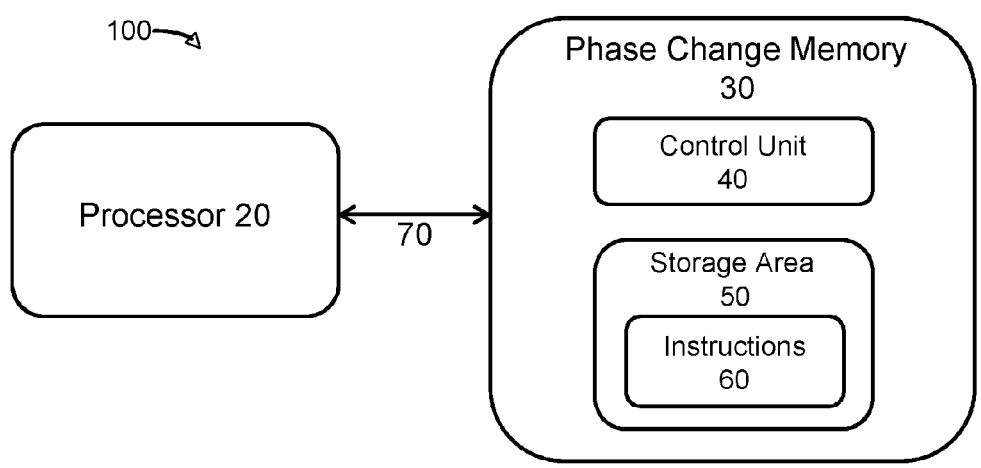
FIG. 1 is a schematic diagram of an example computing platform including phase change memory devices according to an implementation.

Reference is made in the following detailed description to accompanying drawings, which form a part hereof, wherein like numerals may designate like parts throughout to indicate corresponding and/or analogous components. It will be appreciated that components illustrated in the figures may not be drawn to scale, such as for simplicity and/or clarity of illustration. For example, dimensions of some components may be exaggerated relative to other components. Additionally, it is to be understood that other implementations may be utilized. Furthermore, structural and/or other changes may be made without departing from the scope of claimed subject matter. It should also be noted that directions and/or references, for example, up, down, top, bottom, and so on, may be used to facilitate discussion of drawings and/or are not intended to restrict application of claimed subject matter. Therefore, the following detailed description is not to be taken to limit the scope of claimed subject matter and/or equivalents.

DETAILED DESCRIPTION

In implementations, a first phase change material may be deposited adjacent a second phase change material. Thus multiple phase change materials may be connected in parallel between common electrodes. As an example, in a vertical arrangement, the multiple phase change materials in a cell may both (or all) extend vertically between a common lower electrode and a common upper electrode. The term common electrodes is meant to encompass physically separated electrodes that are configured to operate at the same potential.

A first phase change material in a crystalline state may exhibit a first resistance, which may be, for example, significantly larger than a second resistance exhibited by a second phase change material in a crystalline state. Applying a voltage across the electrodes causes current to flow in the phase change materials that may result, at least in part, in changing a state of one or both of the phase change materials from an amorphous to a crystalline state, for example, or from a crystalline to an amorphous state, thereby electrically switching a detectable resistance across the cell. Current flow may cause Joule heating of a phase change memory material, operating as a self-heater, for example, which in turn may result in a change in a state of the material. In other arrangements, more than two phase change materials can be connected in parallel between electrodes.

In particular implementations, a resistance exhibited by a parallel combination of two or more phase change materials may be detected. A detected resistance may, for example, be used to determine an amorphous state, crystalline state, or combination of states, of one or more phase change memory cells. Detected resistances may be associated with logic states for storage of one or more information states of a multi-bit phase change memory cell. For example, a multi-bit phase change memory cell may be used to store information by way of four or more information states, and claimed subject matter is not limited in this respect. Greater numbers of parallel phase change materials can store greater amounts of information per cell in memory implementations. Two parallel phase change materials can provide four cell resistance states, capable of storing two bits of information; three parallel phase change materials can provide eight cell resistance states, capable of storing three bits of information; etc.

Different phase change materials can be provided with sufficiently different resistances in the same phase (e.g., in the crystalline phase) to allow differentiation of states due to those different resistances. Different resistances can be provided through different compositions, such as multiple phase change materials with different components or multiple phase change materials with similar components but different stoichiometry or proportions of components. Phase change materials include chalcogenide materials, such as materials including germanium, antimony and tellurium (GST). One example of such material includes $Ge_2Sb_2Te_5$, and GST with different component ratios can provide different resistivities and thus different resistances. Other examples include, without limitation, GeTe, GeSb, InSe, InSb, AsTe, AlTe, GaSb, SbSe, SbTe, InSbGe, InSbSe, InSbTe, GeSbSe, GeSeGa, GeSbTe, TeGeAs, TeSnSe, BiSeSb, GaSeTe, SnSbTe, TeGeSnO, TeGeSnAu, PdTeGeSn, InSeTiCo, GeSbTeSe, GeSbTePd, GeSbTeCo, GeSnSbTe, GeTeSnNi, GeTeSnPd, GeTeSnPt, SbTeBiSe, AgInSbTe, AgInSbSeTe and combinations thereof. Each of these materials can be provided with different component ratios to further modulate resistances. In one example, a method includes depositing a first germanium-antimony-tellurium layer of a first composition and depositing a second germanium-antimony-tellurium layer of a second composition parallel to a first layer, where the two compositions exhibit different resistivities in their crystalline phases. An electrode may be coupled to one or more of the first and second layers so that an electric current may pass from a first electrode, through intervening first and/or second layers, to a second electrode. In other implementations, additional layers of phase change material may be deposited adjacent and parallel to first and second layers, and claimed subject matter is not limited in this respect.

FIG. 1 is a schematic diagram of an example computing platform (100) including phase change memory devices according to an implementation. In implementations, phase change memory 30 may comprise a storage area 50, including a memory array, such as an array of multi-bit phase change memory cells, in accordance with one or more examples. The phase change memory 30 may, for example, be coupled to a processor 20 by way of a communications bus 70.

In an implementation, the phase change memory 30 may comprise a control unit 40. Additionally, the storage area 50 may store instructions 60 that may include one or more applications that may be executed by the processor 20, for example. The processor 20 may transmit a memory access command to the control unit 40 of the phase change memory 30, for example. The control unit 40 may access one or more memory cells of the storage area 50 at least in part in response to receiving the memory access command from the processor 20. Of course, the computing platform 100 is merely one illustrative example of an implementation and the scope of claimed subject matter is not limited in these respects. The skilled artisan will appreciate other applications for the multi-state phase change cells disclosed herein.

In an implementation, one or more phase change memory cells of the storage area 50 may comprise a chalcogenide material. A single-bit phase change memory device, may store (e.g., retain) information by programming a memory cell to a selected one of at least two states. For example, in a single-bit system, states may be considered binary logic value "0" or "1." In an implementation, a "SET" state, representing binary logic value "1," for example, may correspond to a more crystalline, more conductive state of a material of a memory cell, such as one or more memory cells of the storage area 50. Also, in an implementation, a "RESET" state, representing binary logic value "0," for example, may correspond to a more amorphous, more resistive state of a material for a memory cell, such as one or more memory cells of the storage area 50.

In a phase change memory, such as the phase change memory 30, applying a voltage of sufficient amplitude may result in a state (e.g., phase) change for the cell, such as an individual cell of storage area 50. In implementations, applying a voltage across the electrodes between which the phase change material(s) extend can cause a current to flow through the phase change material, which can generate Joule (i.e., resistive, Ohmic) heating. Each phase change material can be characterized by particular transition temperatures that can "set" to its crystalline state (1) or "reset" (melt) to its amorphous state (0), which in turn can be related to particular current values due to Joule heating. The phase change materials may each act as a self-heater in response to current flow and thus set (crystallize) or reset (amorphize, melt) the phase change material. While the skilled artisan will understand that current flow through the phase change materials causing temperature changes more directly accounts state transitions, out of convenience herein reference will be made to $V_{SET}$ and $V_{RESET}$ that will electrically switch the materials' states, depending upon the circuit arrangement of the cell. In a cell with multiple, parallel phase change materials, the phase change materials act as parallel resistors. Further, in one or more implementations, memory arrays may comprise one or more technologies other than PCM, such as other resistive memory technologies and/or other types of memory that can be electrically switched. Claimed subject matter is not limited in scope to illustrative examples such as these.

FIGS. 2A-2D are illustrations of example electric currents associated with states of phase change materials of a multi-state cell (200) according to an implementation. The multi-state cell can serve as a multi-bit phase change memory cell.

Figure 2A:
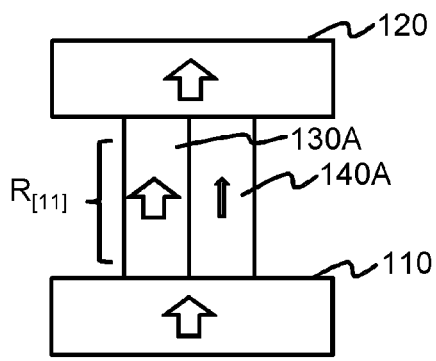
FIGS. 2A-2D are illustrations of multiple resistance states of a cell including multiple phase change materials according to an implementation.

FIG. 2A can represent a logic state [11]. Two phase change materials 130A and 140A both in low resistivity states are shown connected in parallel between electrodes 110 and 120. While shown with common electrodes 110 and 120 at either end, it will be understood that separate electrode pairs can be provided for each phase change material 130A and 140A, and wiring or circuitry can provide operation equivalent to common electrodes. A voltage can be applied such that electric current may flow from electrode 110 to electrode 120 through the intervening phase change materials 130A and 140A, which may exhibit a behavior of two resistors in parallel.

In an implementation, intervening phase change material 130A may be adjacent to phase change material 140A and may comprise phase change materials of differing compositions such that their resistances in the same phase are sufficiently different as to allow differentiation among their states in read and write operations based upon electrical signals across their common electrodes. For example, material 130A may be comprised of germanium-antimony-tellurium that exhibits an electrical resistance significantly less than an electrical resistance exhibited by adjacent material 140A in their crystalline states ($R_{130A} \ll R_{140A}$). In an implementation, a resistance exhibited by phase change material 140A may be at least two times a resistance exhibited by phase change material 140A in their crystalline states ($R_{140A} > 2R_{130A}$). However, in other implementations, resistances exhibited by materials 130A and 140A may be related according to a different ratio. For instance, the resistance ratio of $R_{140A}:R_{130A}$ can be greater than about 4:1 or greater than about 5:1; however, many different resistance ratios may be embraced by the scope of the claims. Phase change materials such as germanium-antimony-tellurium (GST) can readily be provided in different compositions to achieve resistance ratios between about 2:1 and 10:1, and use of other phase change materials with different components can provide other ratios, such as greater than about 10:1 or greater than about 15:1. In general, the greater the differences in resistances among the multiple parallel phase change materials, the more easily different resistive states can be programmed and or discriminated in read operations. The above ratios can extend to examples with greater than 2 PCM materials. In one example, material B has a crystalline resistance more than two times the crystalline resistance of material A, while material C has a crystalline resistance more than two times the crystalline resistance of material B.

In FIG. 2A represents both phase change materials 130A and 140A operating in a low resistance (e.g., crystalline) state. Accordingly, an exhibited resistance, $R_{[11]}$ may be relatively low, which may be interpreted as a particular logic state of a two-bit, for example, logic device. In an implementation, resistances exhibited by a parallel combination of parallel materials 130A and 140A may represent, for example, logic value [11], which may be read by a current measurement in response to a read voltage (e.g., reference voltage 0.2 V). However, such an assignment of a particular logic value, such as [11], may be arbitrary, and other implementations may assign different logic values, such as [10], [01], and so forth, to a condition in which $R_{[11]}$ exhibits a relatively low resistance value.

Figure 2B:
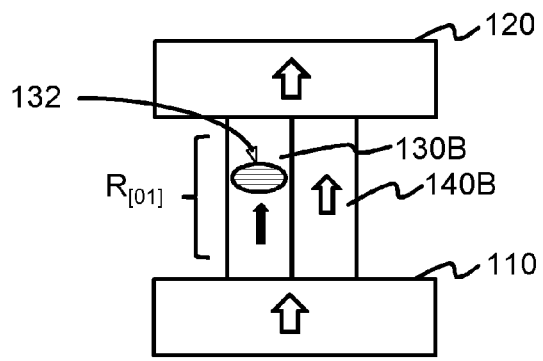

FIG. 2B can represent a logic state [01] with one phase change material 130B in a high resistance state and the other phase change material 140B in a low resistance state. As explained in more detail with respect to FIG. 3, application of a programming voltage across the electrodes 110 and 120 causes electric currents to flow through the phase change materials and may result in at least a portion of material 130A (FIG. 2A) transitioning from a crystalline to an amorphous state, as shown by amorphous region 132. In an implementation, the amorphous region 132 may exhibit a resistance significantly higher than a resistance exhibited by material 130A, discussed with reference to FIG. 2A. Thus, after this transition, in response to the same reference (read) voltage, a relatively smaller electric current may flow through the parallel materials 130B and 140B of FIG. 2B, compared to than the parallel materials 130A and 140A of FIG. 2A. In an implementation, a resistance, $R_{[01]}$, which may be exhibited by a parallel combination of materials 130B and 140B, and which may be read by way of a current measurement in response to a read voltage (e.g., reference voltage 0.2 V), may represent logic value [01], for example. $R_{[01]}$ can represent a higher resistance than $R_{[11]}$ (see FIG. 4 and attendant description).

Figure 2C:
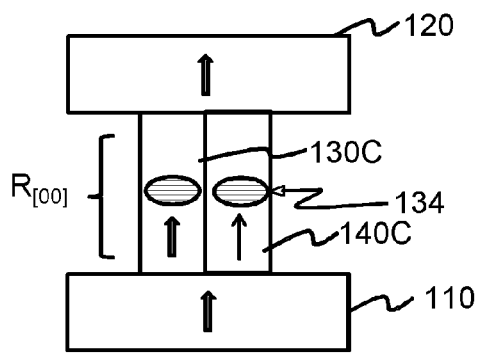

FIG. 2C can represent a logic state [00] with both phase change materials 130C and 140C in high resistance states. As explained in more detail with respect to FIG. 3, application of a programming voltage across the electrodes 110 and 120 causes electric currents to flow through the phase change materials and may result in at least a portion of material 140B (FIG. 2B) transitioning from a crystalline to amorphous state, as shown by amorphous region 134 (FIG. 2C). In an implementation, the amorphous region 134 may exhibit an additional resistance perhaps significantly higher than a resistance exhibited by material 140B of FIG. 2B. Thus, after the transition (in a read condition) a relatively smaller electric current may be allowed to flow through parallel phase change materials 130C and 140C of FIG. 2C compared to the parallel phase change materials 130B and 140B of FIG. 2B, at least in part due to the presence of amorphous regions 132 and 134. In an implementation, a resistance $R_{[00]}$ exhibited by a parallel combination of phase change materials 130C and 140C, which may be read by way of a current measurement in response to a read voltage (e.g., reference voltage 0.2 V), and which may represent the logic value [00], for example. $R_{[00]}$ can represent a higher resistance than either $R_{[11]}$ or $R_{[01]}$ (see FIG. 4 and attendant description).

Figure 2D:
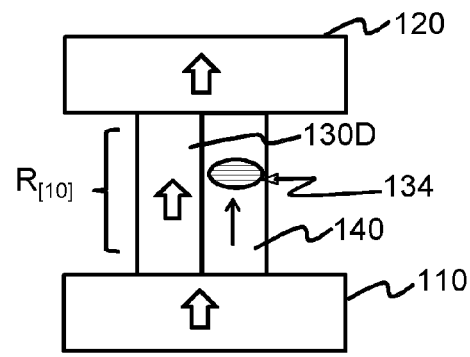

FIG. 2D can represent a logic state [10] with one phase change material 130D in a low resistance state and another phase change materials 140D in a high resistance state. As explained in more detail with respect to FIG. 3, a voltage applied across the electrodes 110 and 120 causes an electric current to flow through the phase change materials and may result in at least a portion of material 130C (FIG. 2C) transitioning from an amorphous to a crystalline state, in which amorphous region 132 from FIG. 2C, for example, is no longer present. In an implementation, after the transition (in a read condition) a relatively higher electric current may be allowed to flow through the parallel phase change materials 130D and 140D of FIG. 2D compared to the parallel phase change materials 130C and 140C of FIG. 2C, at least in part due to crystalline state of material 130D. In an implementation, a resistance $R_{[10]}$, exhibited by a parallel combination of materials 130D and 140D, which may be read by way of a current measurement in response to a read voltage (e.g., reference voltage 0.2 V), and which may represent the logic value [10], for example. $R_{[10]}$ can represent a higher resistance than $R_{[11]}$ or but lower than either $R_{[01]}$ or $R_{[00]}$ (see FIG. 4 and attendant description).

FIGS. 2A-2D represent four resistive states for a cell having two different phase change materials connected in parallel between electrodes. The cell can be transitioned from any of the states to any of the other states in one, two or three steps, as will be clear from the description below of FIG. 3. Moreover, additional states can be attained by providing additional phase change materials connected in parallel between the electrodes. In a memory implementation, the four states can represent two bits of information, since each of the two phase change materials has two states. As will be understood by the skilled artisan in view of the description herein, a cell with three phase change materials connected in parallel between electrodes can define eight different states and can represent three bits of information; a cell with four phase change materials connected in parallel between electrodes can define 16 different states and four bits of information; and n phase change materials connected in parallel between electrodes can define $2^n$ different states and n bits of information.

Figure 3:
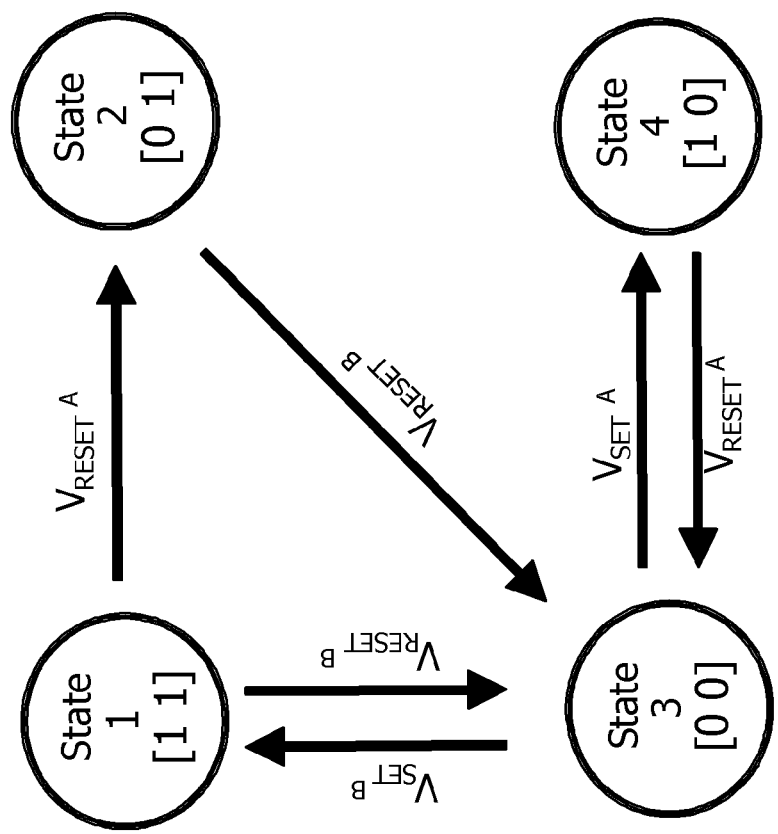
FIG. 3 shows changes in logic values of a multi-state cell set and reset voltages, for example.

FIG. 3 schematically illustrates the four logic states [11], [01], [00] and [10] of FIGS. 2A-2D, respectively, and also illustrates voltages that can be applied to transition from any state to any of the other states in one, two or three steps. FIG. 3 and the description below assume that one of the phase change material layers has significantly higher resistance than the other in the low resistance or crystalline state ($R_{crystalline}A \ll R_{crystalline}B$) and that the voltage for crystallizing the lower resistance material is less than the voltage for crystallizing the higher resistance material ($V_{th}A < V_{th}B$). Under these conditions the multiple phase change materials connected in parallel between electrodes can be set and reset independently of one another simply by selection of voltages applied across their common electrodes. Because the parallel materials act as parallel resistors, common voltages will induce different currents through the different parallel materials, thus having different thermal effects, such that SET and RESET operations can be selective to particular materials. Thus, for simplicity, the transitions are described as induced by certain applied programming voltages herein, but the skilled artisan will appreciate that the transitions can instead be described by way of programming currents and/or programming temperatures. In the description below with reference to FIG. 3, A can represent phase change material 130 of FIGS. 2A-2D, and B can represent phase change material 140 of FIGS. 2A-2D. It will be understood that "amorphized" as employed herein indicates that a sufficient portion of the phase change material is in an amorphous state that the material attains its higher resistance state, and that the material need not be fully amorphized. Similarly, "crystalline" or "crystallized" indicates that a particular phase change material is sufficient crystallized to attain its lower resistance state. It will be understood that the relative terms "lower" and "higher" refer to comparison with the other state of the same material.

A RESET operation is an operation that results in transition from a crystalline (lower resistance) state to an amorphous (higher resistance) state for at least one phase change material. A SET operation in an operation that results in transition from an amorphous (higher resistance) state to a crystalline (lower resistance) state for at least one phase change material.

RESET operation for transition from [11] (A and B both crystalline) to [01] (A is amorphized) can be performed by applying $V_{RESET}A$, which is high enough to cause sufficient current to flow in the material A to amorphize it. Because $R_{crystalline}A \ll R_{crystalline}B$, relatively little current flows in material B when the operation is initiated, and the operation halts after material A is sufficiently amorphized or melted to switch to its higher resistance state.

RESET operation for transition from [11] (A and B both crystalline) to [00] (both A and B are amorphized) can be performed by applying $V_{RESET}B$, which is higher than $V_{RESET}A$, and which is able to amorphize or melt both materials. Alternatively, the same amplitude can be used for both reset voltages, but a shorter pulse duration can be applied to amorphize material A alone, and a relatively longer pulse duration can be applied to amorphize both materials A and B.

RESET operation for transition from [01] (A amorphized, B crystalline) to [00] (both A and B are amorphized) can be performed by applying $V_{RESET}B$. Phase material A is already amorphized and its resistance state is unchanged by $V_{RESET}B$, which is higher than $V_{RESET}A$.

RESET operation for transition from [10] (A crystalline, B amorphized) to [00] (both A and B are amorphized) can be performed by applying $V_{RESET}A$. Phase material B is already amorphized and is unaffected by $V_{RESET}A$, which is lower than $V_{RESET}B$.

SET operation for transition from [00] (A and B both amorphized) to [10] (A is crystallized) can be performed by applying $V_{SET}A$, which is higher than the threshold voltage $V_{th}A$ for crystallizing material A but lower than the threshold voltage $V_{th}B$ for crystallizing material B. Only material A is thus electrically switched to its higher resistance state, as it is the only phase change material to be crystallized under these conditions.

SET operation for transition from [00] (A and B both amorphized) to [11] (both A and B are crystallized) can be performed by applying $V_{SET}B$, which is higher than both $V_{th}A$ and $V_{th}B$.

In the above described implementation, certain voltage levels are set between thresholds for the individual materials, e.g., $V_{SET}A$, is chosen to be higher than the threshold voltage $V_{th}A$ for crystallizing material A but lower than the threshold voltage $V_{th}B$ for crystallizing material B. The skilled artisan will appreciate that instead voltage levels can be chosen such that selection of transitions for different materials can be accomplished by modulation of pulse durations and thus modulation of thermal (Joule) effect. For example, all SET operations can be implemented by applying a voltage above both $V_{th}A$ and $V_{th}B$, and different durations of the set pulse can transition different materials depending upon the desired cell state.

As can be seen from FIG. 3, transition from any of the four illustrated states to any of the other states can be accomplished by one, two or three of the above SET or RESET operations. Thus, the different phase change materials connected in parallel between electrodes can be electrically switched independently of one another. The skilled artisan will appreciate that the principles of operation and electrical switching of parallel materials can be readily extended to three or more different phase change materials connected in parallel between electrodes among multiple cell resistive states. Similarly, any resistive memory technology that can be electrically switched, with different thresholds for different materials, can be arranged in parallel to attain more than two resistive states for the cells, and thus hold multiple bits per cell, applying the principles taught herein.

One of ordinary skill in the art will appreciate that in memory implementations the phase change device forms part of an array of similar phase change devices, each of which can be selectively electrically connected (e.g., by way of an access switch and addressing schemes) to the control unit 40 (FIG. 1) such that the control unit 40 can implement any of the above SET and RESET operations. Similarly, the control unit 40 can implement read operations to sense the state of the phase change device.

Figure 4:
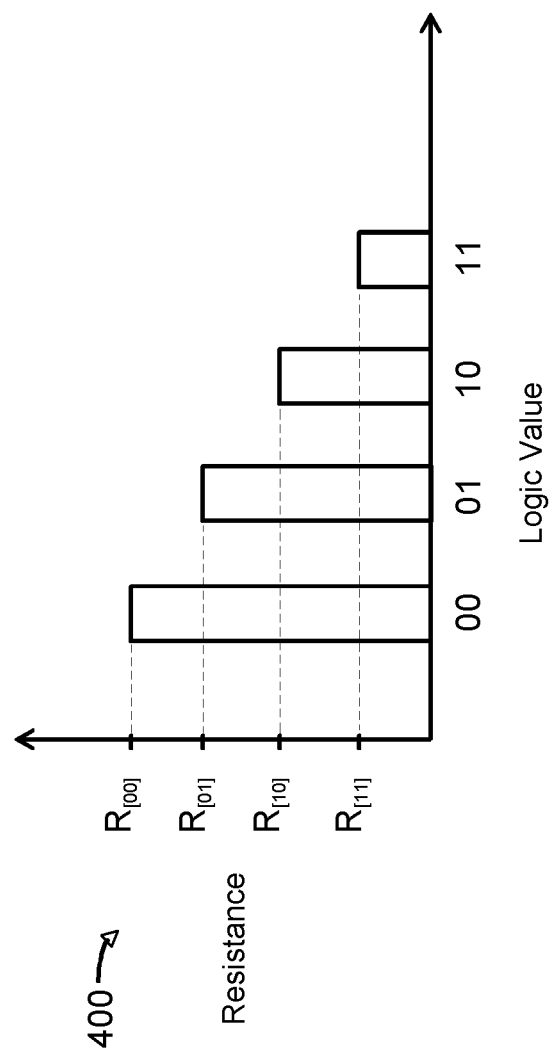
FIG. 4 is an illustration showing relative resistances of device having more than two resistive states, such as a multi-bit memory cell, according to an implementation.

FIG. 4 is an illustration showing relative resistances of an example of a device having more than two resistive states, such as a multi-bit memory cell, according to an implementation. A vertical axis indicates a measure of resistance exhibited by, for example, the four different states of the multi-bit memory cell of FIGS. 2A-2D. A horizontal axis indicates logic values corresponding to resistances exhibited by a multi-bit memory cell. It should be noted that the vertical axis may comprise a linear scale wherein, for example, $R_{[10]} \sim 2R_{[11]}$, a logarithmic scale wherein, for example, $R_{[10]} \sim 10R_{[00]}$, or may make use of any other scale. Logic values, such as the illustrated values of [00], [01], [10] and [11], of a multi-bit memory cell may be determined by detecting exhibited resistances.

In FIG. 4, resistance $R_{[00]}$ may be exhibited by a multi-bit memory cell in which relatively small electric current flows through two or more phase change memory materials wherein the two or more materials operate in an amorphous state. Resistance $R_{[00]}$ may correspond to a multi-bit memory cell according to FIG. 2C, for example, in which phase change materials in a parallel configuration between electrodes comprise an amorphous state. In FIG. 4, resistance $R_{[01]}$ may be exhibited by a multi-bit memory cell in which electric current flows through two or more phase change memory materials wherein a first material operates in an amorphous state and wherein a second material operates in a crystalline state. Resistance $R_{[01]}$ may correspond to a multi-bit memory cell according to FIG. 2B, for example.

In FIG. 4, resistance $R_{[10]}$ may be exhibited in a multi-bit memory cell in which an electric current flows through two or more phase change memory materials wherein a first material operates in a crystalline state while a second material operates in an amorphous state. Resistance $R_{[10]}$ may correspond to a multi-bit memory cell according to FIG. 2D, for example. In FIG. 4, resistance $R_{[11]}$ may be exhibited in a multi-bit memory cell in which electric current flows through two or more phase change memory materials wherein first and second materials operate in a crystalline state. Resistance $R_{[11]}$ may correspond to a multi-bit memory cell according to FIG. 2A, for example.

The skilled artisan will appreciate that additional states can be attained by employing three or more phase change materials connected in parallel between electrodes. Alternatively, while FIG. 3 assumes employment of four logic states using two parallel phase change materials, the skilled artisan will appreciate that two parallel phase change materials can be employed using less that all of the available states. For example, programming can encode changes only among states 1, 3 and 4, omitting employment of state 2, where, for example, it may be easier to distinguish among these three states in read and/or programming operations. In such an example, each cell could encode 1.5 bits and may additionally be employed, e.g., in conjunction with another 3-state cell to define 9 possible states; alternatively, the third state can be employed to encode other information, such as flags or validity/invalidity of data. Similarly, in more complex arrangements of more than two parallel phase change materials, a designer may choose to employ fewer than all of the available states in the programming scheme.

FIGS. 5A-5E are illustrations of example process steps used in fabricating an implementation of a multi-bit phase change memory cell (600). First and second electrodes can be formed, and a plurality of phase change materials can be formed such that the plurality of phase change materials are connected in parallel between the first and second electrodes. In the illustrated vertically aligned memory cell, after a first electrode is formed, forming the plurality of phase change materials includes forming a plurality of parallel, adjacent sidewall spacers. A thermally insulating sidewall spacer can also be formed between at least two of the phase change materials.

Figures 5A, 5B:
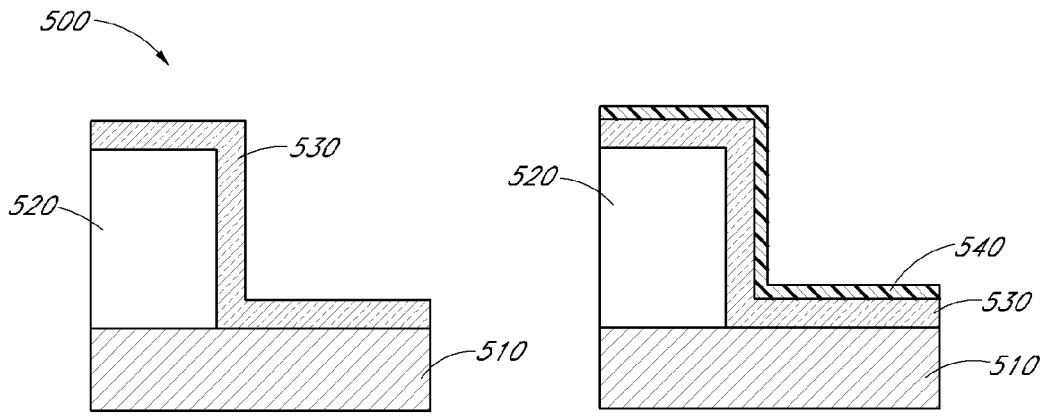
FIGS. 5A-5E are illustrations of process steps used in fabricating an implementation of a multi-bit phase change memory cell according to an implementation.

In FIG. 5A, a bottom electrode 510 may be fabricated followed by formation, e.g., deposition, of an interlevel dielectric material 520, which may be, for example, silicon nitride. However, nothing prevents the use of other dielectric materials, and claimed subject matter is not limited in this respect. The dielectric material 520 may be patterned and a first phase change memory material 530, which may be a chalcogenide material, such as one comprising germanium, antimony, and/or tellurium, may be formed, e.g., deposited, on the dielectric material 520 and the bottom electrode 510.

Figures 5C, 5D:
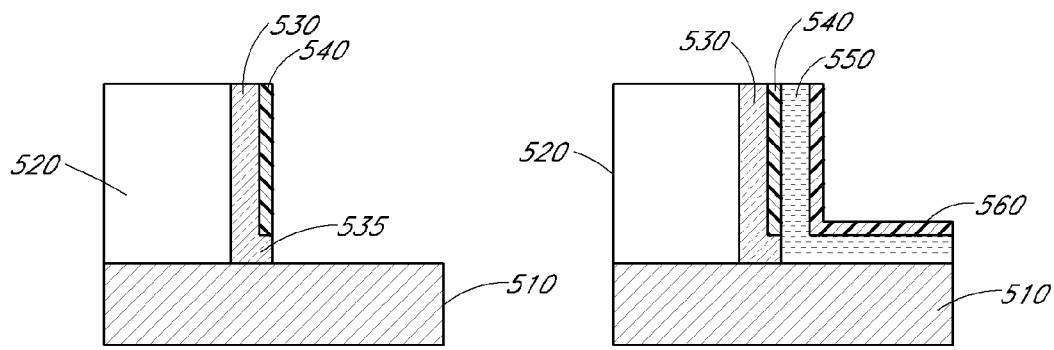

In FIG. 5B, an isolation layer 540, which may reduce or eliminate intermixing among phase change memory materials, may be formed, e.g., deposited, on first phase change memory material 530. While the isolation layer is not illustrated FIGS. 2A-2D and could be omitted, such an isolation layer can reduce thermal cross-talk between different phase change materials and facilitate independent electrical switching as described above. In FIG. 5C, the first phase change memory material 530 and the isolation layer 540 may be patterned, for example using lithography or (as shown) anisotropically etched back similar to a spacer etch process to expose the bottom electrode 510. Because the isolation layer 540 is in place prior to the patterning (e.g., spacer etch) step, the majority of the first phase change memory material 530 is protected from exposure to the patterning process, and an L-shaped first phase change memory material 530 is left with a short horizontal extension 535 beneath the isolation layer 540.

Figure 5E:
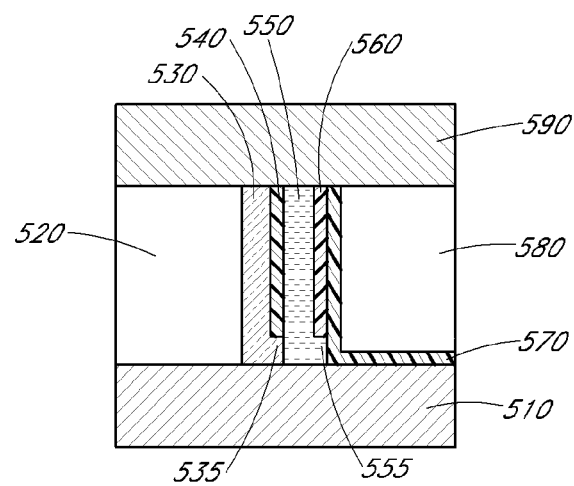

In FIG. 5D, a second phase change memory material 550 may be formed, e.g., deposited, on the electrode 510 and the isolation layer 540 and adjacent to the first phase change memory material 530. A sealing layer 560 may then be formed, e.g., deposited, on the second phase change memory material 550 prior to patterning, as shown in FIG. 5D. In FIG. 5E the sealing layer 560 and second phase change memory material 550 may patterned using lithography or anisotropically be etched back (as shown). Alternatively or additionally, a sealing layer 570 can be deposited after patterning or spacer etch of the second phase change material, shown in addition to the spacer-etched sealing layer 560. It will be understood that either or both of the sealing layers 560 and 570 can be employed as a barrier material if a more porous material is subsequently deposited, such as the illustrated dielectric gap-fill layer 580. Subsequent chemical-mechanical planarization and formation of a top electrode 590 over the first and second phase change materials 530 and 550 can result in the structure of FIG. 5E. Because the isolation layer 560 is in place prior to the patterning (e.g., spacer etch) step, the majority of the second phase change memory material 550 is protected from exposure to the patterning process, and an L-shaped second phase change memory material 550 is left with a short horizontal extension 555 beneath the isolation layer 560.

In certain implementations, one or more processes of FIGS. 5A-5E, may occur by way of low-temperature deposition, which may reduce intermixing among phase change memory layers 530 and 550, particularly if the isolation layer 540 is omitted. In particular implementations, atomic layer deposition may be employed; however, nothing prevents a use of other processes, and claimed subject matter is not limited in this respect.

Figure 6:
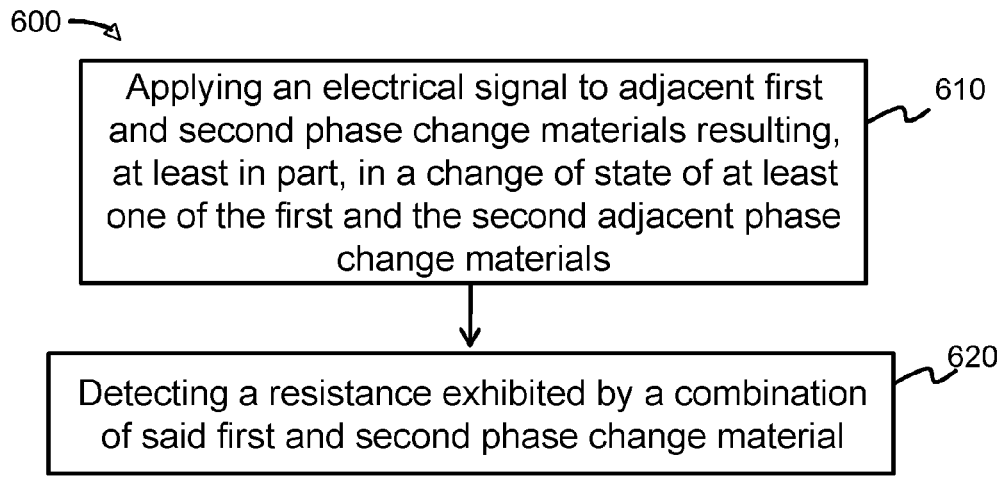
FIG. 6-7 show flowcharts for methods of operating a phase change memory device according to implementations.
Figure 7:
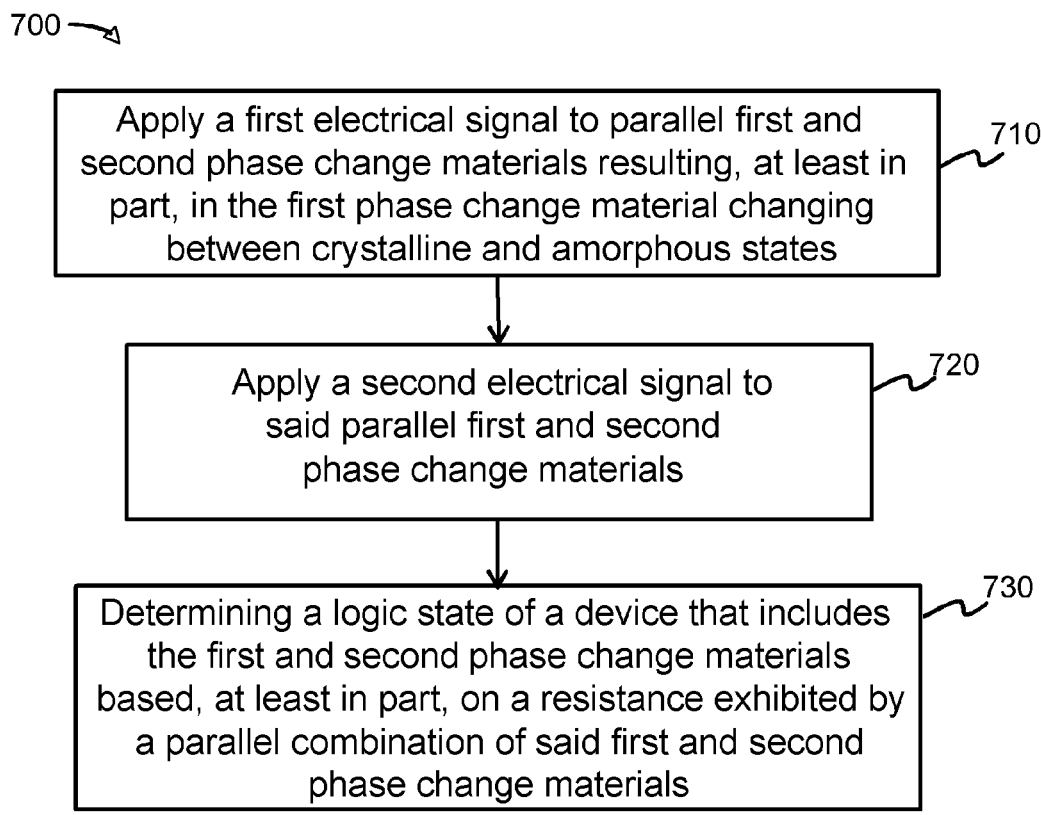

FIGS. 6-7 show flowcharts for methods of operating a phase change memory device according to implementations. In some embodiments, the apparatus of FIGS. 2A-2D may be suitable for performing the methods of FIGS. 6-7, although nothing prevents performing the methods using alternate arrangements of components in other embodiments. Embodiments may include additional blocks than those shown and described, fewer blocks, blocks occurring in an order different from FIGS. 6-7, or any combination thereof.

The method of FIG. 6 begins at block 610, which comprises applying an electrical signal to adjacent first and second phase change materials resulting, at least in part, in a change of state of at least one of the first and the second adjacent phase change materials. Block 620 comprises detecting a resistance exhibited by a combination of the first and second phase change materials. In a memory device implementation, block 610 can represent a programming or write operation, and block 620 can represent a read or sense operation.

FIG. 7 shows a flowchart for a method of operating a phase change memory device according to an implementation. Block 710 comprises applying a first electrical signal to parallel first and second phase change materials resulting, at least in part, in the first phase change material changing between crystalline and amorphous states. For example, the first electrical signal can be a first voltage level applied across common electrodes for the parallel first and second phase change materials. Block 720 comprises applying a second electrical signal to the parallel first and second phase change materials. For example, the second electrical signal may be a second voltage level, different from the first voltage level, applied across common electrodes for the parallel first and second phase change materials. Block 730 comprises determining, a logic state of a device that includes the first and second phase change materials based, at least in part, on a resistance exhibited by a parallel combination of the first and second phase change materials. In a memory device implementation, blocks 710 and 720 can represent a two-stage programming or write operation, such as the transition shown from State 4 to State 1 in FIG. 3. It will be understood that a three-stage programming or write operation can also be performed, such as the transition shown from State 4 to State 2 in FIG. 3. Block 730 can represent a read or sense operation.

In one implementation a phase change device is disclosed. The phase change device includes at least two different phase change materials connected in parallel between electrodes. The phase change materials include a first phase change material and a second phase change material wherein a crystalline state resistance of the second phase change material is distinguishably larger than a crystalline state resistance of the first phase change material.

The phase change device can form part of a self-heating phase change memory cell. The crystalline state resistance of the second phase change material can be at least two times larger than the crystalline state resistance of the first phase change material. In one example, the crystalline state resistance of the second phase change material is greater than about four times the crystalline state resistance of the first phase change material. Additionally, the threshold voltage across the parallel phase change materials for crystallizing the second phase change material can be greater than the threshold voltage across the parallel phase change materials for crystallizing the first phase change material. A thermal insulation layer can also be provided between the first phase change material and the second phase change material. Each of the first and second phase change materials can be an L-shaped sidewall spacer, where the first and second phase change materials are electrically connected in parallel between a common lower electrode and a common upper electrode. Each of the phase change materials can be a chalcogenide, such as one including germanium, antimony and tellurium.

In another implementation, a memory device is disclosed. The memory device includes an array of phase change memory cells. Each of the phase change memory cells includes at least two different phase change materials connected in parallel between electrodes. The phase change materials include first and second phase change materials where a crystalline state resistance of the second phase change material is larger than a crystalline state resistance of the first phase change material to permit differentiation among information states of the phase change memory cells.

Each of the phase change memory cells can be configured for self-heating of the at least two different phase change materials by current flow therethrough to effect phase transitions. The memory device can also include a control unit configured to address and apply electrical signals to the electrodes of each of the phase change memory cells. The control unit can be capable of programming and reading at least four states of each of the phase change memory cells. In one example, two phase change materials can be connected in parallel between the electrodes of each of the phase change memory cells, and the control unit is configured program by applying between one and four of four electrical signal levels in order to control transitions among four resistive states. In this example, each memory cell can store 2 bits of information. One of the two phase change materials can have a resistance at least four times greater than a resistance of the other of the two phase change materials. More generally, each memory cell can include n different phase change materials connected in parallel between the electrodes and the cell is capable of exhibiting $2^n$ resistive states and storing n bits of information.

In another implementation, a method of operating a phase change device is disclosed. The method includes applying an electrical signal across parallel first and second phase change materials resulting, at least in part, in a change of resistive state of at least one of the first and the second phase change materials. A crystalline state resistance of the second phase change material is larger than a crystalline state resistance of the first phase change material to permit differentiation among resistive states.

Applying the electrical signal can include operating the at least one of the first and second phase change materials as a self-heater to cause the change of resistive state. The method of operating can additionally include detecting a resistance exhibited by a combination of the first and second phase change materials and determining a logical state depending upon the resistance exhibited by a combination of the first and second phase change materials. Applying the electrical signal can include changing the resistive state of the first phase change material without changing the resistive state of the second phase change material. Alternatively, applying the electrical signal can including changing a resistive state of the first and second phase change materials. Applying the electrical signal can change a logic state of a memory cell, which includes both the first and second phase change materials, from a first resistive state to a second resistive state. After applying the voltage, a second electrical can be applied across the first and second phase change materials to change the logic state of the memory cell from the second resistive state to a third resistive state. The first and second resistive states can differ in resistance differ by a factor of at least two. Applying the electrical signal can also include applying the electrical signal across a third phase change material connected in parallel with the first and second phase change materials. The method can also include detecting a resistance exhibited by a combination of the first, second, and third phase change materials, and determining a logical state depending upon the resistance exhibited by a combination of the first, second and third phase change materials In another implementation, a method of forming a phase change device is disclosed. The method includes forming a first electrode, forming a plurality of phase change materials in electrical communication with the first electrode, and forming a second electrode in electrical communication with the plurality of phase change materials. The plurality of phase change materials are connected in parallel between the first and second electrode. The phase change materials have distinguishably different resistances in a crystalline state.

Forming the phase change materials can include depositing a first phase change material and a first insulating layer over a sidewall and spacer etching the first phase change material and the first insulating layer together. Forming the phase change materials can also include depositing a second phase change material and a second insulating layer over the sidewall and spacer etching the second phase change material and the second insulating layer together. Forming the phase change materials can also include forming a thermally insulating sidewall spacer between at least two of the plurality of phase change materials. Forming the phase change materials can include atomic layer deposition.

The term "computing platform" as used herein refers to a device that includes an ability to process and/or store data in the form of signals and/or states. Thus, a computing platform, in this context, may comprise hardware, software, firmware or any combination thereof (other than software per se). Computing platform 100, as depicted in FIG. 1, is merely one such example, and the scope of claimed subject matter is not limited to this particular example. For one or more implementations, a computing platform may comprise any of a wide range of digital electronic devices, including, but not limited to, personal desktop or notebook computers, high-definition televisions, digital versatile disc (DVD) players and/or recorders, game consoles, satellite television receivers, cellular telephones, personal digital assistants, mobile audio and/or video playback and/or recording devices, or any combination of the above. Further, unless specifically stated otherwise, a process as described herein, with reference to flow diagrams and/or otherwise, may also be executed and/or controlled, in whole or in part, by a computing platform.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, and/or characteristic in the singular and/or may be used to describe a plurality or some other combination of features, structures and/or characteristics. Though, it should be noted that this is merely an illustrative example and claimed subject matter is not limited to this example.

Methodologies described herein may be implemented by various techniques depending, at least in part, on applications according to particular features and/or examples. For example, methodologies may be implemented in hardware, firmware, or combinations thereof, along with software (other than software per se). In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, or other devices designed to perform functions described herein, or combinations thereof.

In the preceding detailed description, numerous specific details have been set forth to provide a thorough understanding of claimed subject matter. However, it will be understood by those skilled in the art that claimed subject matter may be practiced without these specific details. In other instances, methods and/or devices that would be known by one of ordinary skill have not been described in detail so as not to obscure claimed subject matter.

In some circumstances, operation of a memory device, such as a change in state from binary "1" to binary "0" or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation and/or a physical change or transformation in molecular structure, such as from crystalline to amorphous or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state form binary "1" to binary "0" or vice-versa in a memory device may comprise a transformation, such as a physical transformation. Rather, the foregoing is intended as illustrative examples.

While there has been illustrated and/or described what are presently considered to be example features, it will be understood by those skilled in the art that various other modifications may be made and/or equivalents may be substituted, without departing from claimed subject matter. Additionally, many modifications may be made to adapt a particular situation to the teachings of claimed subject matter without departing from the central concept(s) described herein.

Therefore, it is intended that claimed subject matter not be limited to the particular examples disclosed, but that such claimed subject matter may also include all aspects falling within the scope of appended claims and/or equivalents thereof.

We claim:

1. A phase change device comprising at least two different phase change materials connected in parallel between electrodes, wherein the at least two different phase change materials comprise a first phase change material and a second phase change material, wherein a crystalline state resistance of the second phase change material is distinguishably larger than a crystalline state resistance of the first phase change material, and wherein each of the first phase change material and the second phase change material is configured to undergo a phase change that is caused by self-heating.

2. The phase change device of claim 1, wherein the first and second phase change layers form a part of a self-heating phase change memory cell.

3. The phase change device of claim 1, wherein the crystalline state resistance of the second phase change material is at least two times larger than the crystalline state resistance of the first phase change material.

4. The phase change device of claim 3, wherein the crystalline state resistance of the second phase change material is at least four times larger than the crystalline state resistance of the first phase change material.

5. The phase change device of claim 4, wherein a threshold voltage across the parallel phase change materials for crystallizing the second phase change material is greater than a threshold voltage across the parallel phase change materials for crystallizing the first phase change material.

6. The phase change device of claim 3, further comprising a thermal insulation layer between the first phase change material and the second phase change material.

7. The phase change device of claim 6, wherein each of the first and second phase change materials is an L-shaped sidewall spacer, the first and second phase change materials electrically connected in parallel between a common lower electrode and a common upper electrode.

8. The phase change device of claim 3, wherein each of the first phase change material and the second phase change material comprises a chalcogenide material.

9. The phase change device of claim 8, wherein each of the first and second phase change materials comprise germanium, selenium and tellurium.

10. The memory device of claim 1, wherein each of the first and second phase change materials is elongated in a vertical direction such that each has a length in the vertical direction that is greater than a width in a horizontal direction, and is configured such that a current which causes the self-heating flows in the vertical direction.

11. The memory device of claim 10, wherein each of the first and second phase change materials is configured such that self-heating causes the phase change to occur in vertically central regions of the first and second phase change materials.

12. A memory device comprising an array of phase change memory cells, wherein each of the phase change memory cells includes at least two different phase change materials connected in parallel between electrodes, wherein the at least two different phase change materials comprise a first phase change material and a second phase change material, wherein a crystalline state resistance of the second phase change material is larger than a crystalline state resistance of the first phase change material to permit differentiation among information states of the phase change memory cells, and wherein each of the first phase change material and the second phase change material is configured to undergo a phase change that is caused by self-heating.

13. The memory device of claim 12, wherein each of the phase change memory cells is configured for the self-heating of the at least two different phase change materials by current flow therethrough to effect the phase change.

14. The memory device of claim 12, further comprising a control unit configured to address and apply electrical signals to the electrodes of each of the phase change memory cells.

15. The memory device of claim 13, wherein the control unit is capable of programming and reading at least four states of each of the phase change memory cells.

16. The memory device of claim 15, wherein two phase change materials are connected in parallel between the electrodes of each of the phase change memory cells, and the control unit is configured program by applying between one and four of four electrical signal levels in order to control transitions among four resistive states.

17. The memory device of claim 16, wherein each of the phase change memory cells can store 2 bits of information.

18. The memory device of claim 16, wherein one of the two phase change materials has a resistance at least two times greater than a resistance of the other of the two phase change materials.

19. The memory device of claim 12, wherein each of the phase change memory cells includes n different phase change materials connected in parallel between the electrodes and is capable of exhibiting $2^n$ resistive states and storing n bits of information.

\* \* \* \* \*